United States Patent [19]

Lamb et al.

[11] Patent Number: 4,918,030

[45] Date of Patent: Apr. 17, 1990

[54] METHOD OF FORMING LIGHT-TRAPPING SURFACE FOR PHOTOVOLTAIC CELL AND RESULTING STRUCTURE

[75] Inventors: Walter R. Lamb, Sunnyvale; John E. Lawrence, Cupertino, both of Calif.

[73] Assignee: Electric Power Research Institute, Palo Alto, Calif.

[21] Appl. No.: 332,286

[22] Filed: Mar. 31, 1989

[51] Int. Cl.[4] .............................................. H01L 31/18
[52] U.S. Cl. ...................................... 437/225; 437/2; 156/657; 252/79.5
[58] Field of Search .................. 437/225, 2, 3, 4, 5; 156/657, 653, 647, 625; 148/DIG. 51; 252/79.5

[56] References Cited

U.S. PATENT DOCUMENTS

| | | | |
|---|---|---|---|
| 3,266,961 | 8/1966 | Emeis | 437/225 |
| 3,506,509 | 4/1970 | Kragness | 252/79.5 |
| 3,738,881 | 6/1973 | Erdman | 252/79.5 |
| 3,765,969 | 10/1973 | Kragness | 252/79.5 |
| 4,137,123 | 1/1979 | Barley | 252/79.5 |
| 4,758,368 | 7/1988 | Thompson | 252/79.5 |

OTHER PUBLICATIONS

Ghandhi, S., "VLSI Fabrication . . . ", 1983, pp. 488-489.

*Primary Examiner*—Olik Chaudhuri
*Assistant Examiner*—Kevin McAndrews
*Attorney, Agent, or Firm*—Flehr, Hohbach, Test, Albritton & Herbert

[57] ABSTRACT

An improved textured surface of a photovoltaic device is provided by an anisotropic etching process in which pyramidal structures are formed on a silicon surface having a (100) crystallographic orientation. An aqueous solution of an alkali metal hydroxide is heated to approximately 85° C. whereupon isopropyl alcohol is added. Separated silicon wafers are immersed in the solution for approximately 45 minutes. The wafers can be agitated for a limited time in the solution, and preferably the wafers and solution are covered during the etching step. The resulting pyramids are on the order of 14 microns high and 20 microns on each side of the base. The overlap of the pyramids provides desired random locations for the pyramids.

11 Claims, 1 Drawing Sheet

ALKALI METAL HYDROXIDE (80gm)
↓
DISSOLVE IN 8,000 mL DEIONIZED WATER
↓
HEAT TO 85°C
↓
ADD 600 mL ISOPROPYL ALCOHOL
↓
IMMERSE SILICON WAFERS, COVER
45 MINUTES
↓
REMOVE WAFERS, RINSE, DRY
FIG.—1
2.25 KX
FIG.—2

METHOD OF FORMING LIGHT-TRAPPING SURFACE FOR PHOTOVOLTAIC CELL AND RESULTING STRUCTURE

BACKGROUND OF THE INVENTION

This invention relates generally to photovoltaic cells, and more particularly the invention relates to an improved method of forming a light-trapping surface for a photovoltaic cell.

The photovoltaic cell relies on photons of an impinging radiation source such as the sun to generate electron-hole pairs in a semiconductor body. The electrons and holes migrate to p- and n-doped regions in the semiconductor body to establish a voltage differential and current flow.

The efficiency of the photovoltaic cell depends in part on preventing photons from escaping the semiconductor body by reflection or otherwise prior to forming an electron-hole pair. It is known that the texturing of a surface of a semiconductor body will reduce photon loss as the textured surface acts as a light trap by rereflecting escaping photons back into the semiconductor body.

Heretofore, attempts to trap the light have included roughening a surface mechanically by sand-blasting or molding and by selective dissolution by acids or bases depending on the material utilized in fabricating the photosensitive device.

Chemical etching has been employed in forming the textured surface in a silicon substrate. It is known that an anisotropic etchant can be used to etch a silicon surface having a (100) crystallographic orientation to form pyramidal shapes having sides with (111) crystallographic orientation. See for example Green and Campbell, "Light Trapping Properties of Pyramidally Textured and Grooves Surfaces," *Conference Record, 19th IEEE Photovoltaic Specialists Conference*, May 4-8, 1987. Green and Campbell discuss the effectiveness of various textured surfaces including regular pyramids, random pyramids, and Lambertian surfaces. However, Green and Campbell do not discuss the processing of silicon bodies to achieve the optimal surfaces.

Hall U.S. Pat. No. 4,427,839 discloses a process for forming inverted pyramids on the surface of a silicon body by photoresist masking and etching. Other techniques omit the passivation and photolithography such as Bailey et al., U.S. Pat. No. 4,137,123. Bailey et al. teach etching a (100) silicon surface by an anisotropic etch including silicon in the etchant. The preferred texturing is accomplished by mixing 0-75% by volume ethylene glycol, 0.05-10% by weight potassium hydroxide, and the balance being water plus silicon particles or silicon-containing compounds such as potassium silicate and sodium silicate. Temperatures range from 50° C. to 100° C. An alternate to the ethylene glycol is mentioned, namely isopropyl alcohol.

SUMMARY OF THE INVENTION

An object of the present invention is an improved method of fabricating a textured surface for a photovoltaic cell.

Another object of the invention is an improved light-trapping surface formed by isotropic etching of silicon.

Another object of the invention is increased photovoltaic cell efficiency.

Briefly, an aqueous solution of alkali metal hydroxide, such as potassium hydroxide or sodium hydroxide, is dissolved in deionized water and heated to approximately 85° C. Isopropyl alcohol is then added to the solution. A group of separated and cleaned silicon wafers having surfaces with (100) crystallographic orientation are immersed in the solution and then covered. After a period of time, the cover and the wafers are removed and the wafers are rinsed in deionized water and then dried.

The resulting textured surface has large pyramids (e.g. approximately 20 microns per side at the base and 14 microns high) with sides having (111) crystallographic orientation. The overlapping of the pyramids provides somewhat smaller pyramids and a desired random location of the pyramids. The process has proved to be consistent in reproducing a textured surface of desired light-reflecting characteristics.

The invention and objects and features thereof will be more fully understood from the following detailed description and appended claims when taken with the drawing.

BRIEF DESCRIPTION OF THE DRAWING

FIG. 1 is a flow diagram of the process in forming an optimum textured surface in accordance with the invention.

FIG. 2 is a scanning electron micrograph (2,250×magnification) of a surface etched in accordance with the invention and viewed from a 45° angle from the surface.

DETAILED DESCRIPTION OF ILLUSTRATIVE EMBODIMENTS

Referring now to the drawing, FIG. 1 is a flow diagram of the process for forming a textured surface of a photovoltaic cell in accordance with the invention. The invention utilizes an anisotropic etchant to etch the surfaces of silicon wafers having (100) crystallographic orientation to achieve a textured pyramidal surface with pyramids having an optimum size and random orientations.

In accordance with a preferred embodiment of the invention, 80 grams of an alkali metal hydroxide, sodium hydroxide or potassium hydroxide, for example, is dissolved in 8,000 milliliters of deionized water. The solution is then heated to 85° C., and 600 milliliters of isopropyl alcohol is then added.

Thereafter, a group of separated and cleaned silicon wafers having (100) crystallographic surface orientations are immersed in the solution. The solution container is then covered to prevent evaporation and permit repeat utilization of the solution for other groups of wafers. After 45 minutes at approximately 85° C., the cover is removed and the group of wafers is withdrawn from the solution. The wafers are rinsed in deionized water, and then dried.

The wafers can be agitated for a limited period of time (e.g. five minutes) upon initial immersion in the etchant solution, but this is not critical. Tests have been performed which varied the temperature of the etchant solution by +/−10° C., but a temperature of 85° C., plus or minus 1° C., has proved to be optimum. The provision of the lid on the container is essential if the solution is to be used in subsequent wafer processing.

FIG. 2 is a scanning electron micrograph (10,000×magnification) of a surface etched in accordance with the invention and viewed from a 45° angle from the surface. The larger pyramids have base dimensions of 20.8 microns per side, and a pyramid height of 14.5 microns. The overlap of the pyramids provides some smaller pyramids, and the desired random location of the pyramids is visible from the micrograph. The process in accordance with the invention provides a textured surface for a photovoltaic cell with pyramids of a preferred size and random orientation for optimum light-trapping.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A method of fabricating a light-trapping textured surface of a photovoltaic cell comprising the steps of
   (a) providing silicon wafers having surfaces with (100) crystallographic orientation,
   (b) providing an aqueous solution of an alkali metal hydroxide,
   (c) heating said aqueous solution to approximately 85° C.,
   (d) adding isopropyl alcohol to the heated aqueous solution,
   (e) immersing said silicon wafers in said heated aqueous solution for sufficient time to etch surfaces of said wafers and form pyramidal shapes on said surfaces, and
   (f) removing and rinsing said silicon wafers in deionized water.

2. The method as defined by claim 1 wherein step (b) includes providing potassium hydroxide.

3. The method as defined by claim 2 wherein step (b) includes providing 100 ml of deionized water for every gram of potassium hydroxide, and step (d) includes providing 60 ml of isopropyl alcohol for every 8 grams of potassium hydroxide.

4. The method as defined by claim 3 wherein step (e) includes immersing said silicon wafers for approximately 45 minutes with the temperature of said aqueous solution being maintained at approximately 85° C.

5. The method as defined by claim 4 wherein the temperature of said aqueous solution is maintained at 85° C. +1° C.

6. The method as defined by claim 4 and further including the step of agitating said silicon wafers in said aqueous solution for a limited period of time.

7. The method as defined by claim 6 wherein said limited period of time is approximately 5 minutes.

8. The method as defined by claim 7 and further including the step of covering said silicon wafers and said aqueous solution during step (e).

9. The method as defined by claim 1 and further including the step of agitating said silicon wafers in said aqueous solution for a limited period of time.

10. The method as defined by claim 9 wherein said limited period of time is approximately 5 minutes.

11. The method as defined by claim 1 and further including the step of covering said silicon wafers and said aqueous solution during step (e).

* * * * *